United States Patent [19]
Balachandran et al.

[11] Patent Number: 5,882,536
[45] Date of Patent: Mar. 16, 1999

[54] METHOD AND ETCHANT TO JOIN AG-CLAD BSSCO SUPERCONDUCTING TAPE

[75] Inventors: Uthamalingam Balachandran, Hinsdale; Anand N. Iyer, Downers Grove, both of Ill.; Jiann Yuan Huang, Hsinchu, Taiwan

[73] Assignee: The University of Chicago, Chicago, Ill.

[21] Appl. No.: 541,210

[22] Filed: Oct. 12, 1995

[51] Int. Cl.$^6$ .................................................. H01L 21/302
[52] U.S. Cl. ............................ 216/43; 505/100; 505/450; 505/500; 505/121; 216/100; 216/103; 156/89.17; 156/47; 156/158; 156/304.6
[58] Field of Search .................................. 29/599; 427/62; 505/500, 230, 23, 739, 450, 728, 430; 156/47; 216/100

[56] References Cited

U.S. PATENT DOCUMENTS

| | | | |
|---|---|---|---|
| 5,192,739 | 3/1993 | Lay | 505/1 |
| 5,439,879 | 8/1995 | Salama et al. | 505/500 |

OTHER PUBLICATIONS

Appl'd Superconductivity, vol. 2, No. 3/4, pp. 251–259, '94 Elsevier Science in U.K., "Recent Issues in Fabrication of High–T$_c$".
JOM, vol. 45, No. 9, 9/93, pp. 54–57 "The Powder–in–Tube Processing and Properties of Bi–2223".
IEEE Trans. on Appl'd Superconductivity, vol. 3, No. 1, 3/93 "Superconducting joints Formed Between Powder–in–Tube".
Journal of Materials, vol. 22, Nov. 10, 1993, "Melt–Formed Superconducting Joints for Nb$_3$Sn Tape".
"CRC Handbook of Metal Etchants" pp. 1146–1155.
"Metallography Principles and Practice" McGraw–Hill 1984, p. 685.
"Fabrication of Superconducting Joints for Bi–2212 Pancake Coils" IEE App. vol. 3, issue 1, 1992, pp. 935–938.
1995 Elseviere Science B.V. "A Study of joining Ag/BSCCO Superconducting tapes".
IEEE, 1991 "High Temperature Superconductor Joints" pp. 927–930.
Japenese jrnl. of Apld. physics, vol. 29, No. 8, Aug. 1990, pp.L142–L1434 "Diffusion Bonding of Bi—pb—Sr—Ca—Cu—O high—T$_c$".
IOP Publishing, Ltd. 1992, "Microwave Joining of Bi$_{1.6}$Pb$_{0.4}$Sr$_2$Ca$_2$C$_3$O$_x$ Superconductors".

*Primary Examiner*—Marian C. Knode
*Assistant Examiner*—Rebecca A. Fuldner
*Attorney, Agent, or Firm*—Emrich & Dithmar

[57] ABSTRACT

A method of removing a silver cladding from high temperature superconducting material clad in silver (HTS) is disclosed. The silver clad HTS is contacted with an aqueous solution of HNO$_3$ followed by an aqueous solution of NH$_4$OH and H$_2$O$_2$ for a time sufficient to remove the silver cladding from the superconducting material without adversely affecting the superconducting properties of the superconducting material. A portion of the silver cladding may be masked with a material chemically impervious to HNO$_3$ and to a combination of NH$_4$OH and H$_2$O$_2$ to preserve the Ag coating. A silver clad superconductor is disclosed, made in accordance with the method discussed.

29 Claims, 2 Drawing Sheets

NEW CONFIGURATION

OLD CONFIGURATION

NEW CONFIGURATION

METHOD AND ETCHANT TO JOIN AG-CLAD BSSCO SUPERCONDUCTING TAPE

CONTRACTUAL ORIGIN OF THE INVENTION

The United States Government has rights in this invention pursuant to Contract No. W-31-109-ENG-38 between the U.S. Department of Energy and The University of Chicago representing Argonne National Laboratory.

BACKGROUND OF THE INVENTION

In 1986 Bednorz and Muller disclosed that certain mixed phase compositions of La—Ba—Cu—O appeared to exhibit superconductivity beginning at an onset temperature of about 30° K., over 7 degrees above the critical temperature of known $Nb_3Ge$ compositions. Bednorz et al., Z. Phys. B., Condensed Matter, Vol. 64, pp. 189–198 (1986). The superconducting composition was determined to have a crystalline structure like that of $K_2Ni_1F_4$, and is therefore referred to as a 214 composition. It has since been determined that whatever the rare earth metal or the alkaline earth metal constituent of such a 214 system may be, the upper temperature limit of superconducting onset, $T_{CO}$, of superconductors of a 214 type crystalline structure is no greater than about 38° K. Liquid helium is still required as the coolant for such a 214 type of material.

Following the discovery of superconductivity in a rare earth-alkaline earth Cu oxide system of a 214 crystalline structure, a new class of rare earth-alkaline earth-copper oxides was discovered which are superconductive at temperatures above the boiling point of liquid nitrogen, 77° K. These new rare earth-alkaline earth-copper oxides are now recognized as one of three oxide systems, a YBaCuO system, a BiSrCaCuO (with Pb dopping) system and a TlBaCaCuO system. These high-temperature superconductors (HTS) are oxide ceramics but for industrial uses need to be sheathed in a good electrical conductor which will not chemically interfere with the superconducting properties, such as silver.

The unit cell formula for one class of HTS compounds is $L_1M_2Cu_3O_{6+\delta}$ ($\delta$=0.1 to 1.0, preferably about 1.0) wherein the constituent, L, is yttrium, lanthanum, neodymium, samarium, europium, gadolinium, dysprosium, holmium, erbium, thulium, ytterbium, or lutetium, or mixtures thereof including mixtures with scandium, cerium, praseodymium, terbium and the alkaline earth constituent, M, is barium, strontium or mixtures thereof. Among this class of 123 HTS compounds, that most preferred is $Y_1Ba_2Cu_3O_{6+\delta}$.

The 123 HTS compounds have a perovskite related crystalline structure. The crystalline unit cell of such 123 compounds consists of three sub-cells in alignment along the crystallographic C-axis wherein the center of the middle subcell is occupied by a rare earth metal atom (L), the center of each end subcell is occupied by an alkaline earth metal atom (M), the corner positions of each subcell are occupied by copper atoms, and intermediate the copper atoms along the edges of the subcells are sites for occupation by oxygen atoms. X-ray and neutron powder diffraction studies indicate the structure of superconductive 123 compounds to be oxygen deficient and that the ordering of oxygen in the basal planes is critical to the existence of superconducting properties in such compounds. See C. Poole et al., *Copper Oxide Superconductors* (John Wiley & Sons 1988).

Studies indicate that when $\delta$ is between about 0.1 to about 0.6, the resulting 123 compound assumes a tetragonal unit cell crystallographic symmetry and is non-superconductive. In the tetragonal unit cell symmetry, the lattice dimension of the c axis is approximately 11.94 angstroms and that of the a and b axes is equal, approximately 3.9 angstroms. When $\delta$ is between 0.7 and 1.0, the resulting 123 compound has an orthorhombic unit cell crystallographic symmetry and is superconductive. The orientation of the oxygen atoms in the orthorhombic unit cell causes the unit cell to compress slightly along the a crystallographic axis and thus the lattice dimension of the a axis is less than that of the b axis. Lattice constants in the orthorhombic symmetry are about a=3.82, b=3.89 and c=11.55 angstroms.

For use in superconducting magnets, it is most efficient and desirable to produce a HTS in the form of a wire, ribbon, plate or cylindrical form. A wire/ribbon form enables the convenient fabrication of the wire-ribbon coils of the superconducting magnet. Yet, to have commercially practical application for superconducting magnets, the wire/ribbon in which a HTS compound is produced must have in the maximum field of the magnet a $J_c$ at a minimum order of $10^3$ $A/cm^2$. For commercially practical applications in power transmissions lines, the wire/ribbon in which a HTS compound is produced must have in the maximum field of the magnet a $J_c$ of at least about $10^3$ to about $10^5$ $A/cm^2$ in a magnetic field of about 1T.

The superconductivity of an ideal orthorhombic lattice network is anisotropic and it has been determined that the critical current density $J_c$ is greatest when measured along the axis in the a-b plane of the unit cell. However, articles composed of the orthorhombic compositions which have been produced by solid state reaction are granular and though containing grains with a near perfect lattice structure, the grains of the aggregate material are poorly aligned. Thus, articles composed of such sintered compositions are isotropically superconductive and exhibit current densities below that required for commercial use in superconducting magnets and transmission lines.

Anisotropic superconductivity has been attained on a macroscopic scale in cold pressed and sintered forms of superconductors produced by solid state reaction through the process of melt-texturing wherein the form is heated beyond the peritectic temperature of the superconducting composition to incongruently melt the composition into $L_2M_1CuO_5$ and a liquid phase and cooled at a controlled rate to precipitate out grains of the superconducting material. The effective application of the melt-texturing process causes the precipitation of highly aligned grains, which imparts to the bulk article composed of the precipitated grains anisotropic superconductivity approaching that of the ideal lattice network.

Due to the slow kinetics of melt-texturing methods, fabrication of large anisotrophically superconducting articles is time consuming. Typical growth rates of the aligned grain structure are on the order of a few millimeters per hour. In addition, large articles require stringent processing conditions to maintain uniform grain alignment throughout the article.

Preparation of large articles from segments of melt-texturized segments wherein the larger article has comparable $J_c$ properties to those of the segments of which it is composed, would be one means for overcoming the size constraints. Joining segments of bulk superconductor provides a way by which the attractive properties of melt processed materials can be extended to larger sizes and different shapes. For example, in addition to the possibility of fabricating long conductors capable of carrying high currents, superconducting magnets with uniform field profiles over larger areas could be made for bearing applications.

Ag-clad BSCCO conductors are formulated in long lengths by the well known powder-in-tube method providing advantages in sinter forging or hot pressing. A tape resulting from the powder-in-tube method is suitable for use in the subject invention.

SUMMARY OF THE INVENTION

The invention in one aspect thereof relates to a method and chemical etchant for joining silver clad superconducting tape segments to provide longer lengths more suitable for magnetic windings and the like. Select portions of the silver cladding are removed by exposing the silver cladding successively to an aqueous solution of nitric acid and to an aqueous solution of ammonium hydroxide and hydrogen peroxide. Another aspect of the invention is to provide an overlapping construction for a lap joint in which not only are double thicknesses of the superconducting ceramic juxtaposed, but double thicknesses of silver cladding are provided on both sides of the joint, thereby resulting in a joint of improved current conducting characteristics.

Accordingly, an object of the invention is to provide a method of removing a silver cladding from high temperature superconducting material clad in silver wherein the silver clad superconducting material is contacted sequentially with an aqueous solution of nitric acid and an aqueous solution of ammonium hydroxide and hydrogen peroxide for a time sufficient to remove the silver cladding from the superconducting material without adversely affecting the superconducting properties.

Another object of the invention is to mask a portion of the silver cladding with a material impervious to nitric acid and to a combination of ammonium hydroxide and hydrogen peroxide, prior to contacting the unmasked portions of the silver cladding with the nitric acid and the combination of the ammonium hydroxide and hydrogen peroxide.

Yet another object of the invention is to provide an improved silver clad superconducting material in the form of an elongated tape having a plurality of joints axially spaced there along joining individual segments of silver clad superconducting material wherein the joints have been formed by the method previously disclosed.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 1:
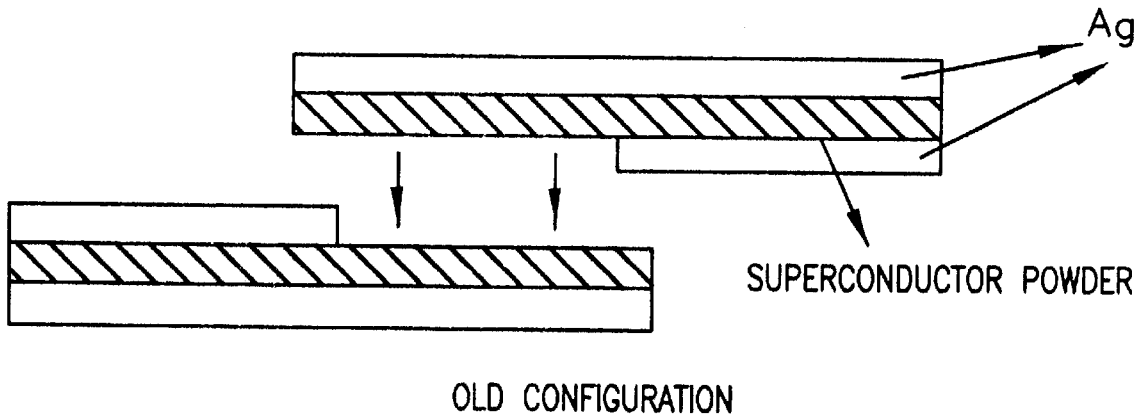
FIG. 1 is a schematic drawing showing a prior art lapped joint.

Although the invention is described with respect to the lead doped bismuth, strontium, calcium, copper oxide superconductor, any of the oxide ceramic superconductors are applicable to the invention provided that they are silver clad and formulated into shapes capable of forming a lap joint. As is known, silver clad BSCCO conductors fabricated using the powder-in-tube process show considerable promise for commercial applications such as motors, generators, power transmission, magnetic resonants imaging, current buses, low-loss leads to other superconductor coils and devices. The basic requirement of the aforementioned applications is that long lengths of conductors with high current capacities need to be produced. Employing a two-step rolling and heat treatment process 30 to 77 meter lengths of silver clad BSCCO conductors with $J_c$ of about 60 to 80 percent of short rolled samples have been made. Nevertheless, the fabrication of sufficient quantities of conductors with comparable $J_c$s is a formidable task even on an industrial level. The best alternative is to develop superconducting joints between the powder-in-tube tapes.

The preferred method for providing lap joints for segments of powder-in-tube material is to remove the silver sheath without degrading or altering the superconductive core. It has been found that a two-step treatment with an aqueous solution of nitric acid followed by an aqueous solution of ammonium hydroxide and hydrogen peroxide has efficiently removed the silver from a silver clad superconducting tape. Moreover, macroscopic observation of the etched tape indicates that the etchant had no detrimental effect on the superconductor core.

In an example of the invention, the various steps in formulating the joint are set forth below along with a short table showing the current capacity within the joint, across the joint and for a tape without a joint.

1. The joint as formed between two Ag-clad BSCCO tapes, each about 2" long.

2. Leaving the surface($\approx \frac{1}{2}$–1") to be etched exposed, the rest of the tape was carefully masked with TEFLON tetra fluoropolyethylene sheath.

3. The tapes were first treated with a solution of dilute $HNO_3$ (65% by volume) for $\approx$5– minutes. They were then treated, with a solution of $NH_4OH+H_2O_2$ for up to about 20 minutes, until a uniform layer of the superconducting core was exposed.

4. The TEFLON from the surface of the tape was burnt by heating it for 40 minutes at 350° C.

5. A lap-joint was formed by bringing the exposed surface of the tapes together and heat treating them at 840° C. for $\approx$2 hours. In order to obtain a good joint, a light load was placed on the tapes.

6. The tapes were then visually inspected for the quality of the joint.

7. The joined tapes were then heat treated at 840° C. for 46 hours. At this time no load was placed on the tape.

8. The tapes were characterized for their transport properties, using the four-point-probe technique and with 1 $\mu$V/cm as the criteria.

9. Critical current ($I_c$) of the tape after about 48 hours (2+46) is $\approx$0.2 across joint and is $\approx$3.5 A within the joint. $I_c$ of a regular tape, subjected to the same heat treatment, is $\approx$2.5 A.

10. The tapes were subjected to a series of thermomechanical treatments at 840° C. for 100 hours.

11. Before each heat treatment, the tapes were pressed at 20 Tons for 5 seconds.

12. After first round, $I_c$ is $\approx$7.5 A across joint, as compared to 10 A for the regular tape, subjected to the same heat treatment.

13. After second round, $I_c$ is $\approx$8.5 A across joint and $\approx$24 A within the joint, as compared to 20 A for the regular tape, subjected to the same heat treatment.

14. After third round, $I_c$ is ≈2 A across and ≈26 A within the joint, as compared to 20 A for the regular tape, subjected to the same heat treatment.

15. Before each heat treating, tapes were pressed at 20 Tons for 5 seconds.

16. Blisters were formed along the length of tape (including the joint) during/after conductivity characterization.

17. The following table shows the Ic of joined tape as well as regular tape.

|  | Ic within joint | Ic across joint | Ic of regular tape |
| --- | --- | --- | --- |
| After 48 hours | 3.5 | 0.25 | 2.5 |
| After round 1 | — | 7.5 | 10 |
| After round 2 | 24 | 8.5 | 20 |
| After round 3 | 20 | 1.3, 2 | 19 |

*Unit for Ic: Amperes

More particularly, it has been found that the nitric acid may be present in an aqueous solution in the range of from about 35% to about 65% by volume. The best results have been obtained using a concentration of 56 volume percent nitric acid and 44 volume percent water. Moreover, it has been found that the pH of the aqueous nitric acid solution should be in the range from 1 to about 2. It has been found that the nitric acid should be in contact with a preselected portion of the silver clad tape segment for a time in a range of from about 3 minutes to about 10 minutes, and the temperature of the nitric acid solution should be maintained in the range of from about 15° C. to about 40° C. during the contact with the silver cladding.

It has been found that the ammonium hydroxide should be present in the range of from about 12% to about 14% by volume of the aqueous solution and the hydrogen peroxide should also be present in the same range, that is from about 12% to about 14% by volume. It has also been determined that the pH of the aqueous solution of ammonium hydroxide and hydrogen peroxide should be in the range of from about 8 to about 9, and the temperature should be maintained in the range of from about 10° C. to about 15° C. during contact with the superconducting material. Moreover, it has been found that the time of contact should be in the range of from about 2 minutes to about 10 minutes.

In order to provide a good joint, it has been found adequate to provide a light load administered in a direction perpendicular to the a-b plane of two unclad superconducting ceramics followed by suitable heat treatment, such as at sintering temperatures of about 840° C. More specifically, however, it has also been found that pressing under a load of between about 5 to about 20 tons for about 5 seconds followed by heat treatment also provides a good joint. The current characteristics have improved when the pressing and heat treatment steps are repeated once and the current characteristics have diminished if the pressing and heat treatment steps are repeated more than once. It has been found that the preferred temperature to which the material is heated is about 840° C. and that it is preferred that the tapes be maintained at such a temperature for a total time of about 46 hours. Times of about 40 hours and times of about 48 hours are also acceptable.

Referring to the drawings, FIG. 1 shows a prior art lap joint configuration in which the ceramic superconducting material is overlapped to form a lap joint, but the silver cladding may be butted to form a butt joint.

Figure 2:
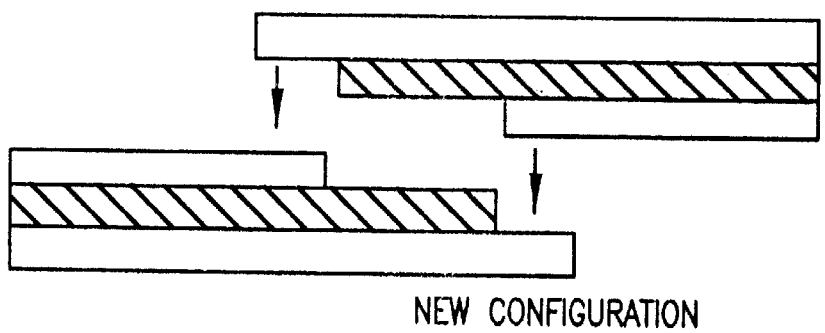
FIG. 2 is a schematic drawing showing a lapped joint of the present invention.

FIG. 2 shows the preferred construction of the present invention in which both the ceramic material and the silver cladding material are positioned to form lap joints so that unlike the prior art configuration, the silver cladding also forms lap joints.

Figure 3:
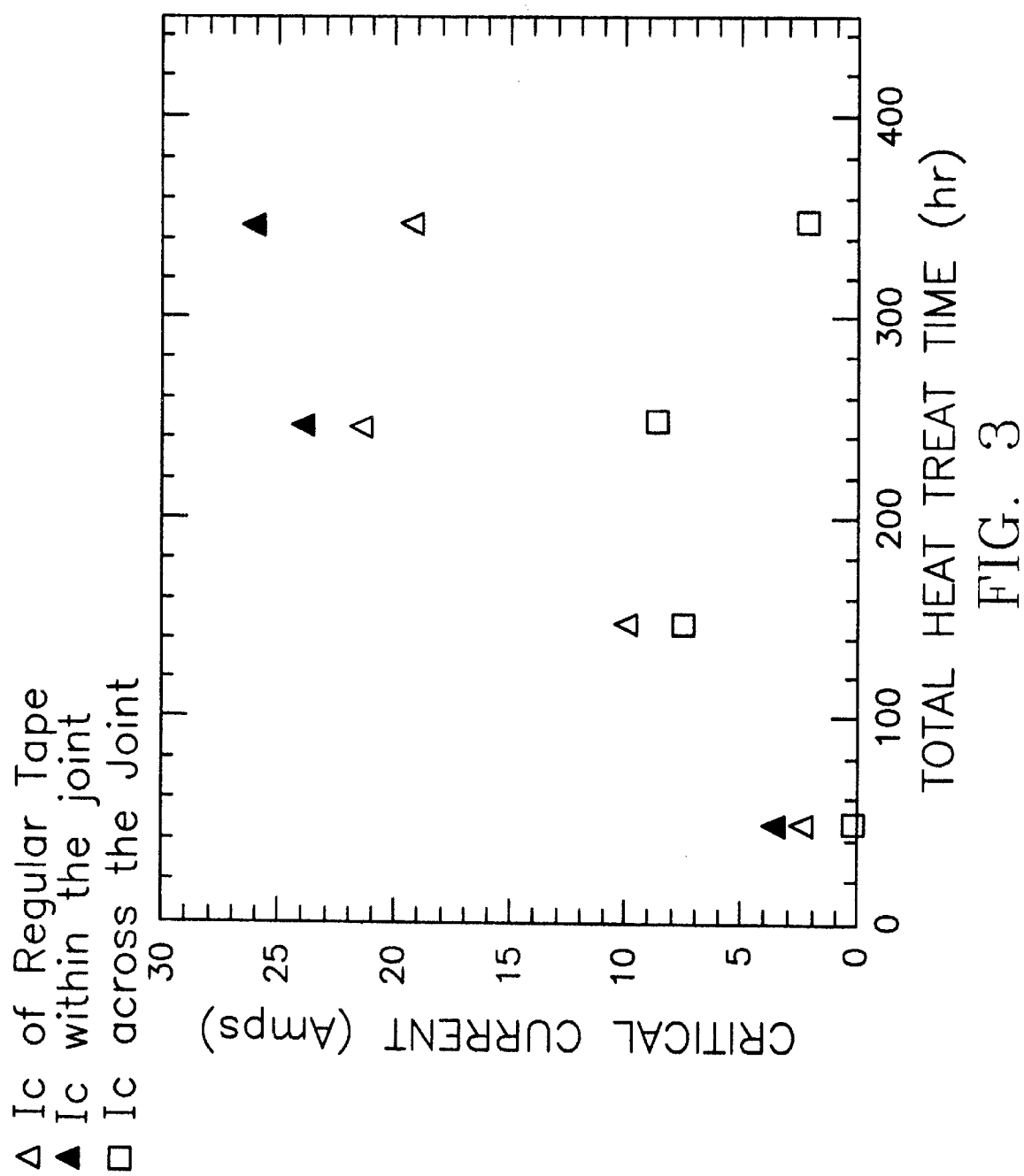
FIG. 3 is a graphical representation of the relationship between the critical current as a function of the total heat treatment time for a tape segment and measurements taken across a joint and within a joint.

FIG. 3 shows a graphical representation of the data generated during the heat treatment of a tape without a joint and a tape with a lap joint as shown in FIG. 2 of the drawings. As seen by the graph of FIG. 3, the $I_c$ within the joint is greater for the lap joint than for the regular tape while the $I_c$ across the joint is somewhat less. It is believed that the $I_c$ across the joint is less because of cracks in the edge of the tape due to the joint process.

In order to direct the etchant to the portion of the tape from which the silver is to be removed, it is advantageous to coat the tape with a material which is impervious to the chemical etchants. Such a material is "Teflon" or tetra fluoropolyethylene. By coating the taped segments with "Teflon" in those areas in which the silver is not to be removed, the tape may be in contact with the chemical etchant for a time sufficient to remove the silver. Thereafter, the Teflon is removed by heating to a temperature at which the Teflon is vaporized, for instance 350° C. for about 40 minutes, see step 4 in the example. Materials other than Teflon which are impervious to chemical attack may be used in place of Teflon but the preferred embodiment of the invention is as described.

Attached is a Table showing prior art etchants in Runs 1–4 and 7–9, with the inventive method being illustrated in Runs 5 and 6.

While there has been disclosed what is considered to be the preferred embodiment of the present invention, it is understood that various changes in the details may be made without departing from the spirit, or sacrificing any of the advantages of the present invention.

| No. | Etching Solution | Concentration (ml) | Actual Concentration* (%) | Temperature | Time |
| --- | --- | --- | --- | --- | --- |
| 1 | $NH_4OH/H_2O_2/H_2O$ | 5/0.5/5 | 14.3/1.4/74.3 | R.T. | 4 hrs |
| 2 | $HNO_3$ | 90 | 70 | R.T. | 1–5 hrs |
| 3 | Stage I - $NH_4OH/H_2O_2/H_2O$ | 16/16/10 | 11.4/11.4/77.2 | 60° C. | 33 min |
|  | Stage II - $NH_4OH/H_2O_2/H_2O$ | 200/200/27 | 14/14/72 | — | 20–40 min |
| 4 | $NH_4OH/H_2O_2/H_2O$ | 200/200/13.5 | 14.5/14.5/71 | 55° C. | — |
| 5 | Stage I - $HNO_3/H_2O$ | 50/50 | 35/65 | R.T. | 10 min |
|  | Stage II - $NH_4OH/H_2O_2/H_2O$ | 200/200/27 | 14/14/72 | R.T. | 20 min |
| 6 | Stage I-$HNO_3/H_2O$ | 80/20 | 56/44 | 25–40° C | 5 min |
|  | Stage II - $NH_4OH/H_2O_2/H_2O$ | 100/100/13.5 | 14/14/72 | 10–15° C. | 10 min |
| 7 | $HNO_3/H_2O$ | 32.5/17.5 | 45.5/54.5 | R.T. | 20–25 min |

-continued

| No. | Etching Solution | Concentration (ml) | Actual Concentration* (%) | Temperature | Time |
| --- | --- | --- | --- | --- | --- |
| 8 | $HNO_3/H_2O$ | 40/10 | 56/44 | R.T. | 40 min |
| 9 | Pure Hg | — | — | R.T. | >10 hrs |

*The numbers in this column (except that of water) were calculated based on the fact that the concentration of $HNO_3$, $H_2O_2$, and $NH_4OH$ are 70, 30, and 30 volume % respectively.

We claim:

1. A method of removing a silver cladding from high temperature superconducting material clad in silver (HTS) comprising contacting the silver clad HTS with an aqueous solution of $HNO_3$ followed by an aqueous solution of $NH_4OH$ and $H_2O_2$ for a time sufficient to remove the silver cladding from the superconducting material without adversely affecting the superconducting properties of the superconducting material.

2. The method of claim 1, wherein the aqueous $HNO_3$ solution contains between about 35% and 65% $HNO_3$ by volume.

3. The method of claim 1, wherein the pH of the aqueous $HNO_3$ solution is from about 1 to about 2.

4. The method of claim 1, wherein the HTS is contacted with the aqueous solution of $HNO_3$ for a time in the range of from about 3 minutes to about 10 minutes.

5. The method of claim 1, wherein the temperature of the aqueous $HNO_3$ solution is maintained in the range of from about 15° C. to about 40° C. during contact with the silver cladding.

6. The method of claim 1, wherein the aqueous solution of ammonium hydroxide and hydrogen peroxide has $NH_4OH$ present in the range of from about 12% to about 14% by volume, $H_2O_2$ present in the range of from about 12% to about 14% by volume.

7. The method of claim 1, wherein the aqueous solution of $NH_4OH$ and $H_2O_2$ has a pH in the range of from about 8 to about 9.

8. The method of claim 1, wherein the temperature of the aqueous solution of $NH_4OH$ and $H_2O_2$ is maintained in the range of from about 10° C. to about 15° C. during contact with the HTS previously contacted with $HNO_3$.

9. The method of claim 1, wherein the HTS previously contacted with $HNO_3$ is contacted by the aqueous solution of $NH_4OH$ and $H_2O_2$ for a time in the range of from about 2 to about 10 minutes.

10. The method of claim 1, wherein the HTS is $Pb_{0.4}Bi_{1.8}Sr_2Ca_2Cu_3O_x$.

11. The method of claim 1, wherein the HTS is divided into segments with each segment having an a-b plane and further comprising positioning two segments of HTS having the silver cladding removed from a portion thereof in contact with each other such that the a-b planes are parallel, applying a light load perpendicular to the a-b plane for a time sufficient to form a joint between the two unclad portions of HTS segments and heating to a sintering temperature.

12. The method of claim 1, wherein the HTS is divided into segments with each segment having an a-b plane, and further comprising positioning two segments of HTS having the silver cladding removed from a portion thereof in contact with each other such that the a-b planes are parallel and mechanically pressing the two portions in a direction perpendicular to the a-b planes and thereafter heating to a temperature of about 840° C.

13. The method of claim 12, wherein the pressing is at a pressure in the range of from about 5 to about 20 tons per square inch, and the pressed portions are heated for a period of time in excess of about 40 hours.

14. The method of claim 13 wherein the mechanical pressing and heat treating steps are repeated.

15. A method of removing a predetermined amount of silver cladding from a silver clad high temperature superconductor, comprising masking a portion of the silver cladding to be preserved with a material chemically impervious to $HNO_3$ and to a combination of $NH_4OH$ and $H_2O_2$, contacting the silver cladding to be removed with an aqueous solution of $HNO_3$ followed by an aqueous solution of $NH_4OH$ and $H_2O_2$ for a time and at a temperature sufficient to remove the predetermined amount of silver cladding.

16. The method of claim 15, and further removing the material chemically impervious to $HNO_3$ or to a combination of $NH_4OH$ and $H_2O_2$ from the silver clad high temperature superconductor.

17. The method of claim 15, wherein the material chemically impervious to $HNO_3$ or to a combination of $NH_4OH$ and $H_2O_2$ is "Teflon" tetra fluoropolyethylene.

18. The method of claim 17, wherein the tetra fluoropolyethylene is removed by heating to a temperature sufficient to vaporize same.

19. A method of forming a joint between two or more segments of high temperature superconducting material clad in silver (HTS) comprising contacting a preselected portion of each HTS segment with an aqueous solution of $HNO_3$ followed by an aqueous solution of $NH_4OH$ and $H_2O_2$ for a time sufficient to remove the silver cladding from the preselected portions of the HTS segments without adversely affecting the superconducting properties of the unclad HTS, positioning two of the preselected portions of the HTS segments having the silver cladding removed in contact with each other such that the a-b planes of the segments are parallel, applying a load perpendicular to the a-b planes for a time sufficient to form a joint between the two segments and heating to a sintering temperature.

20. The method of claim 19, wherein each HTS segment is a tape having opposed flat surfaces with the silver cladding removed on a portion of at least one surface.

21. The method of claim 20, wherein each segment has silver extending beyond the end of the tape segment on the side of the tape opposite to the surface having the cladding removed.

22. A silver clad superconducting material in the form of an elongated tape having a plurality of joints axially spaced there along joining individual segments of silver clad superconducting material, each of said joints formed by contacting portions of adjoining segments of silver clad superconducting material with an aqueous solution of $HNO_3$ followed by an aqueous solution of $NH_4OH$ and $H_2O_2$ at a suitable temperature and for a time sufficient to remove the silver cladding from the portions without adversely affecting the superconducting properties of the superconducting material, positioning two segments having portions of the silver cladding removed such that the tapes are parallel and the portions having the silver removed in registry, applying a load perpendicular to the longitudinal axis of the tape segments to form a joint between the two segments and heating to a sintering temperature.

23. The silver clad superconducting material of claim 22, wherein the superconducting material is $Pb_{0.4}Bi_{1.8}Sr_2Ca_2Cu_3O_x$.

24. The silver clad superconducting material of claim 22, wherein the pH of the aqueous $HNO_3$ solution is from about 1 to about 2 and the pH of the aqueous solution $NH_4OH$ and $H_2O_2$ is from about 8 to about 9.

25. The silver clad superconducting material of claim 23, wherein the portions of the segments are contacted with the aqueous $HNO_3$ solution for a time in the range of from about 3 to about 10 minutes and are contacted with the aqueous solution of $NH_4OH$ and $H_2O_2$ for a time in range of from about 2 to about 10 minutes.

26. The silver clad superconducting material of claim 24, wherein the temperature of the aqueous $HNO_3$ in contact with the segments is maintained in the range of from about 15° C. to about 40° C. and the temperature of the aqueous solution of $NH_4OH$ and $H_2O_2$ is maintained in the range of from about 10° C. to about 15° C.

27. The silver clad superconducting material of claim 26, wherein the load is in the range of from about 5 to about 20 tons and the sintering temperature is about 840° C., the joint being held at the sintering temperature for at least about 40 hours.

28. The silver clad superconducting material of claim 22, wherein the steps of applying a load and sintering are repeated.

29. The silver clad superconducting material of claim 27, wherein each segment has silver extending beyond the end of the tape segment on the side of the tape opposite to the surface having the cladding removed.

* * * * *